(12) United States Patent
Okada et al.

(10) Patent No.: US 8,715,838 B2
(45) Date of Patent: May 6, 2014

(54) SURFACE-COATED CUTTING TOOL

(75) Inventors: Yoshio Okada, Itami (JP); Minoru Itoh, Itami (JP); Hideaki Kanaoka, Itami (JP); Chie Suzuki, Itami (JP); Anongsack Paseuth, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 21 days.

(21) Appl. No.: 13/393,473

(22) PCT Filed: Jun. 10, 2011

(86) PCT No.: PCT/JP2011/063351
§ 371 (c)(1),
(2), (4) Date: Feb. 29, 2012

(87) PCT Pub. No.: WO2012/063515
PCT Pub. Date: May 18, 2012

(65) Prior Publication Data
US 2012/0282049 A1    Nov. 8, 2012

(30) Foreign Application Priority Data

Nov. 10, 2010    (JP) .................................. 2010-251705

(51) Int. Cl.
*B23B 9/00*    (2006.01)
*B23B 5/14*    (2006.01)
*B23P 15/28*    (2006.01)

(52) U.S. Cl.
USPC ........... 428/688; 428/610; 428/698; 428/702; 428/908.8; 51/307; 51/309; 407/119

(58) Field of Classification Search
None
See application file for complete search history.

(56) References Cited

U.S. PATENT DOCUMENTS

| 2005/0042482 A1 | 2/2005 | Okada et al. |
| 2006/0154108 A1 | 7/2006 | Fukui et al. |
| 2007/0184272 A1* | 8/2007 | Moriguchi ................. 428/411.1 |
| 2007/0292670 A1* | 12/2007 | Okada et al. .................. 428/216 |
| 2009/0130434 A1 | 5/2009 | Zhu et al. |
| 2011/0053463 A1 | 3/2011 | Beaudonnet |

FOREIGN PATENT DOCUMENTS

| CN | 1620349 A | 5/2005 |
| CN | 1845808 A | 10/2006 |
| JP | 2001-062603 A | 3/2001 |
| JP | 2001-096404 A | 4/2001 |

(Continued)

OTHER PUBLICATIONS

Barbatti et al., "Influence of micro-blasting on the microstructure and residual stresses of CVD k-$Al_2O_3$ coatings," Surface and Coatings Technology, vol. 203, No. 24, pp. 3708-3717 (2009).

(Continued)

*Primary Examiner* — Gwendolyn Blackwell
*Assistant Examiner* — Seth Dumbris
(74) *Attorney, Agent, or Firm* — Venable LLP; Michael A. Sartori; Tamatane J. Aga

(57) ABSTRACT

Wear resistance and chipping resistance are both highly established for a surface-coated cutting tool. The surface-coated cutting tool of the present invention includes a base material and a coat film formed on the base material. A first coat layer at a chamfer portion has residual stress that exhibits a minimal value at a depth A within 2 μm from the surface, and that is greater than or equal to −7 GPa and less than or equal to −1 GPa.

6 Claims, 4 Drawing Sheets

(56) References Cited

FOREIGN PATENT DOCUMENTS

| | | |
|---|---|---|
| JP | 2006-035383 A | 2/2006 |
| JP | 2009-078309 A | 4/2009 |
| JP | 2010-137315 A | 6/2010 |
| KR | 2007-0026386 A | 3/2007 |
| KR | 10-0817658 B1 | 3/2008 |
| WO | WO-2006/064724 A1 | 6/2006 |
| WO | WO-2009/081026 A2 | 7/2009 |

OTHER PUBLICATIONS

Office Action in Korean Patent Application No. 10-2012-7006046, dated Sep. 17, 2013.

Office Action in Chinese Patent Application No. 201180004081.7, dated Sep. 27, 2013.

* cited by examiner

SURFACE-COATED CUTTING TOOL

TECHNICAL FIELD

The present invention relates to a surface-coated cutting tool, particularly a surface-coated cutting tool covered with a coat film for improving wear resistance and chipping resistance.

BACKGROUND ART

For cutting tools, cemented carbide (WC—Co alloy, or the same having carbon nitride such as Ti (titanium), Ta (tantalum), or Nb (niobium) added to) has been conventionally used. However, in accordance with the trend of high speed cutting in the recent years, cutting tools covered with at least one layer of a coat by using cemented carbide, cermet, sintered cubic boron nitride, or alumina type or silicon nitride type ceramic as the base material, and applying chemical vapor deposition (CVD) or physical vapor deposition (PVD) on the surface has become pervasive. The coat layer has a thickness of 3-20 μm, and is formed of a compound including a first element of at least one type selected from the IVa group element, Va group element, VIa group element from the periodic table of elements, Al (aluminum), Si or B, and a second element of at least one type selected from B, C, N or O (when the first element is B alone, the second element excludes B).

The demand for saving energy and reducing the cost in modern cutting machinery is high. Accordingly, the demand for further increase in speed and feeding, as well as high efficiency in machining is elevating in terms of the cutting machining conditions. Further, the trend is towards low cost, high strength, and lightness in the machine components. The workpiece material employed in components has become difficult to be cut, rendering difficulty in the machining of the workpiece material. In view of the foregoing, various approaches have been taken to increase the chipping resistance and lifetime of cutting tools.

As an approach directed to increasing the lifetime of a cutting tool, Japanese Patent Laying-Open No. 2001-062603 (Japanese Patent No. 3661503, Patent Literature 1), for example, discloses a coat film of an oblong crystal texture, having residual stress differing between the upper section and lower section of the coat film. Specifically, residual compressive stress is applied to the upper layer of the coat film while residual tensile stress is applied to the lower layer of the coat film, whereby the chipping resistance of the cutting tool is improved.

Japanese Patent Laying-Open No. 2001-096404 (Patent Literature 2) discloses the approach of improving chipping resistance by covering with a hard coat layer including the stack of a Ti compound layer, a titanium carbonitride layer, a titanium carbide layer, and an aluminum oxide layer.

Japanese Patent Laying-Open No. 2009-078309 (Patent Literature 3) teaches improving the chipping resistance by introducing compressive stress towards the outer layer side of a hard coat layer covering the surface of a surface-coated cutting tool by means of blasting.

Further, WO2006/064724 (Patent Literature 4) discloses a coat film including a first coat formed of α-$Al_2O_3$ to which compressive stress is applied at the surface side and a second coat formed of TiCN to which tensile stress is applied at the inner side. This coat film has the toughness and wear resistance improved by setting the tensile stress of the first coat and the compressive stress of the second coat to satisfy a predetermined relationship.

CITATION LIST

Patent Literature

PTL 1: Japanese Patent Laying-Open No. 2001-062603
PTL 2: Japanese Patent Laying-Open No. 2001-096404
PTL 3: Japanese Patent Laying-Open No. 2009-078309
PTL 4: WO2006/064724

SUMMARY OF INVENTION

Technical Problem

Although sufficient performance in the chipping resistance can be achieved by the approach disclosed in the aforementioned Patent Literatures 1-4, the wear resistance was not sufficient to satisfy the demand for current cutting tools.

In view of the foregoing, an object of the present invention is to provide a surface-coated cutting tool with both wear resistance and chipping resistance highly established.

Solution to Problem

As a result of diligent study to solve the problems set forth above, the inventors of the present invention arrived at the finding that differentiating the crystal texture of the chamfer portion of the coat film from the crystal texture of another portion of the coat film other than the chamfer portion and applying different residual stress to respective crystal textures are most effective for highly establishing both wear resistance and chipping resistance. By further research based on this finding, the inventors came to complete the present invention.

A surface-coated cutting tool of the present invention includes a base material, and a coat film formed on the base material. The surface-coated cutting tool has a chamfer portion where a rake face and a flank face meet. The coat film includes at least one layer of a first coat layer. The first coat layer is the outermost surface layer of the coat film at the chamfer portion. The first coat layer at the chamfer portion has residual stress that exhibits a minimal value at a depth A within 2 μm from the surface, and that increases continuously or stepwise as a function of depth in a further depth direction from said depth A. The minimal value of the residual stress is greater than or equal to −7 GPa and less than or equal to −1 GPa. The first coat layer at a portion other than the chamfer portion has residual stress greater than the minimal value of the residual stress, and that increases continuously or stepwise as a function of advance in the central direction of the rake face and the central direction of the flank face. The residual stress of the first coat layer other than the chamfer portion is greater than or equal to 0 GPa and less than or equal to 2 GPa at the base material side. In the first coat layer of the chamfer portion, the region from the surface up to depth A is a fine crystal texture region including crystals having an average grain size greater than or equal to 10 nm and less than or equal to 200 nm. In the first coat layer, the region further in the depth direction from depth A at the chamfer portion and the region other than the chamfer portion is a rough crystal texture region including crystals larger than the crystal in the fine crystal texture region.

The first coat layer preferably has a thickness greater than or equal to 2 μm and less than or equal to 30 μm. Although the first coat layer is preferably the outermost surface layer also at other regions in addition to the chamfer portion, the first coat layer does not necessarily have to be the outermost surface layer.

The coat film is preferably formed of a compound including at least one type of element selected from the group consisting of a IVa group element, Va group element, VIa group element, Al, Si, Y, B, and S, and at least one type of element selected from the group consisting of boron, carbon, nitrogen, and oxygen. The coat film preferably includes one or more layers other than the first coat layer. The coat film preferably has an entire thickness greater than or equal to 3 μm and less than or equal to 50 μm. The first coat layer is preferably formed of alumina.

Advantageous Effects of Invention

The surface-coated cutting tool of the present invention allows both wear resistance and chipping resistance to be highly established by the structure set forth above.

DESCRIPTION OF EMBODIMENTS

The present invention will be described in detail hereinafter. In the present invention, it is assumed that the layer thickness or film thickness is measured using a scanning electron microscope (SEM).

<Surface-Coated Cutting Tool>

The surface-coated cutting tool of the present invention includes a base material, and a coat film formed thereon. The surface-coated cutting tool of the present invention having this basic configuration is significantly useful as a drill, end mill, indexable insert for drilling, indexable insert for end milling, indexable insert for milling, indexable insert for lathing, metal saw, gear cutting tool, reamer, tap, and the like.

Figure 1:
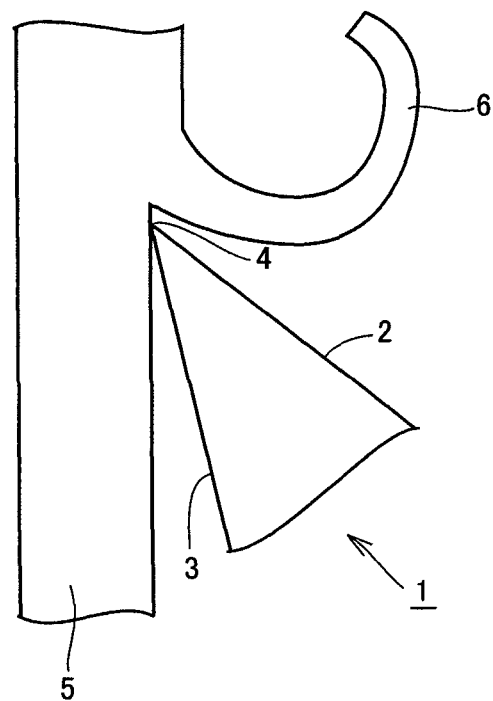
FIG. 1 is a schematic view of a surface-coated cutting tool and a workpiece material in a contacting state during a cutting operation.

FIG. 1 is a schematic view of a surface-coated cutting tool and a workpiece material in a contacting state during a cutting operation. A surface-coated cutting tool 1 of the present invention includes a rake face 2 brought into contact with a swarf 6 of workpiece material 5 in a cutting operation, and a flank face 3 in contact with the workpiece material itself, as shown in FIG. 1. The ridge where rake face 2 and flank face 3 meet is a chamfer portion 4 subjected to a cutting edge treatment. Chamfer portion 4 is the region where surface-coated cutting tool 1 is brought into the contact with workpiece material 5, and particularly critical in the cutting tool.

Figure 2:
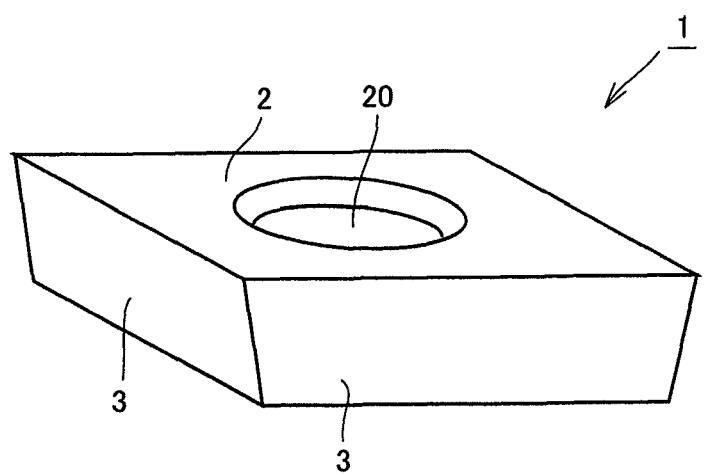
FIG. 2 is a schematic view of a surface-coated cutting tool having a rake face of a square shape.

FIG. 2 is schematic diagram of a surface-coated cutting tool having a square-shape rake face 2. In the case where surface-coated cutting tool 1 of the present invention is an indexable insert type cutting tool, a through hole 20 may be formed passing through the top face and bottom face of rake face 2 at the middle of the indexable insert cutting tool. This through hole 20 is used as a fixation hole for attaching a tool. As necessary, another fixing means may be provided in addition to or alternative to the fixation hole.

<Chamfer Portion>

Figure 3:
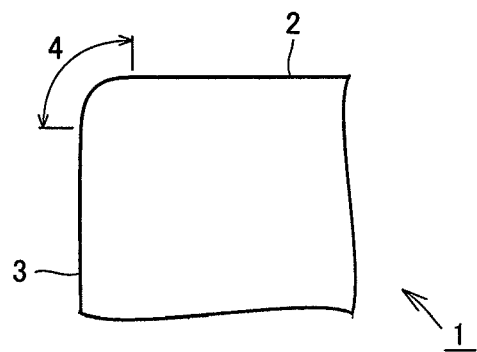
FIG. 3 is a schematic sectional view of a chamfer portion that is chamfered in a curve.
Figure 4:
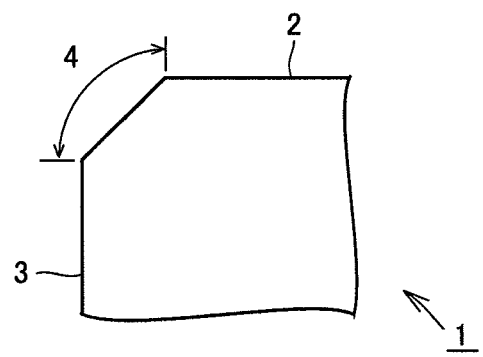
FIG. 4 is a schematic sectional view of a chamfer portion that is chamfered in a flat plane.

FIG. 3 is a schematic sectional view of a chamfer portion that is chamfered to have a curved face. FIG. 4 is a schematic sectional view of a chamfer portion that is chamfered to have a flat face. In the present invention, chamfer portion 4 implies a portion that is chamfered (honing portion) at the region corresponding to the ridge where rake face 2 and flank face 3 meet, subjected to a cutting edge treatment so as to have a curve, as shown in FIG. 3, as well as a portion that is chamfered (negative land portion) by linear cut off of the region corresponding to the ridge where rake face 2 and flank face 3 meet, as shown in FIG. 4. Moreover, a portion based on a combination of the above-described chamfered process is included.

Chamfer portion 4 is formed by subjecting the ridge where rake face 2 and flank face 3 meet to grinding, brushing, barreling treatment, blasting, buffing, honing, and the like. When the surface-coated cutting tool is in plan view from the rake face direction or flank face direction (FIG. 4), the width of chamfer portion 4 is preferably greater than or equal to 0.01 mm and less than or equal to 0.2 mm, more preferably greater than or equal to 0.02 mm and less than or equal to 0.1 mm.

<Base Material>

As the base material for the surface-coated cutting tool of the present invention, any well-known base material for a cutting tool may be used without limitation. For example, cemented carbide (for example, WC based cemented carbide, including Co in addition to WC, or those further added with a carbon nitride such as Ti, Ta, Nb), cermet (those with TiC, TiN, TiCN and the like as the main component), high-speed steel, ceramics (titanium carbide, silicon carbide, silicon nitride, aluminum nitride, aluminum oxide, a composite thereof, or the like), sintered cubic boron nitride, sintered diamond, sintered boron nitride, or a composite formed of aluminum oxide and titanium carbide can be cited as the base material.

Among the base materials set forth above, cemented carbide (WC based cemented carbide) is preferable. This is because cemented carbide is an alloy having both hardness and strength, having extremely favorable balance since cemented carbide contains iron group metal such as cobalt with tungsten carbide of high hardness as the main component. In the case where such cemented carbide is employed as the base material, the advantage of the present invention can be exhibited even if the cemented carbide includes free carbon or an abnormal phase called η phase in the texture.

The base material may have the surface modified. For example, in the case where cemented carbide is employed, a β free layer may be formed at the surface. In the case where cermet is employed, a surface harden layer may be formed. The advantage of the present invention is exhibited even if the surface is modified.

<Coat Film>

In the surface-coated cutting tool of the present invention, the coat film formed on the base material is characterized in including at least a first coat layer. The coat film of the present invention may be formed by a first coat layer alone (in this case, the first coat layer will be formed in contact with the base material), or include one or more additional layer other than the first coat layer. This layer other than the first coat layer may be formed between the base material and the first coat layer, or on the first coat layer, as will be described afterwards. Even in the case where the layer other than the first coat layer is formed on the first coat layer, the first coat layer is the outermost layer (the layer constituting the surface of the coat film) at the chamfer portion involved in cutting. By virtue of the first coat layer including crystals having a different average grain size depending upon the site, the first coat layer has residual stress suitable for that site. Thus, both wear resistance and chipping resistance can be highly established. The grain size and residual stress of the first coat layer will be described afterwards.

The coat film of the present invention includes the case where the entire face of the base material is covered, the case where the coat film is provided only partially, and also the case where the layering state of a portion of the coat film is partially different.

Preferably, the coat film of the present invention has an entire thickness that is greater than or equal to 3 μm and less than or equal to 50 μm. If the thickness is less than 3 μm, the wear resistance may be degraded. If the thickness exceeds 50 μm, the adherence with the base material as well as the chipping resistance may be degraded. Particularly, the coat film has a thickness preferably greater than or equal to 5 μm and less than or equal to 25 μm.

For the coat film of the present invention, the well-known coat film used for the application set forth above can be used without particular limitation. The coat film of the present invention is preferably formed of a compound including at least one type of element selected from the group consisting of the IVa group element (Ti, Zr, Hf, or the like), Va group element (V, Nb, Ta, or the like), VIa group element (Cr, Mo, W, or the like) of the periodic table of elements, aluminum (Al), silicon (Si), yttrium (Y), boron (B), and sulfur (S), and at least one type of element selected from the group consisting of boron, carbon, nitride, and oxygen (excluding the case where both elements are B). For the compound, a carbide, nitride, oxide, boride, carbonitride, carbon oxide, oxynitride, carbon oxynitride, or the like of elements selected from the group consisting of the aforementioned IVa group element (Ti, Zr, Hf, or the like), Va group element (V, Nb, Ta, or the like), VIa group element (Cr, Mo, W, or the like), aluminum (Al), silicon (Si), and yttrium (Y) can be cited. A solid solution thereof may be included.

For the compound, a nitride, carbide, oxide, carbonitride, oxynitride, carbon oxynitride, or the like of Ti, Al, $(Ti_{1-x}Al_x)$, $(Al_{1-x}Zr_x)$, $(Ti_{1-x}Si_x)$, $(Al_{1-x}Cr_x)$, $(Ti_{1-x-y}Si_xAl_y)$ or $(Al_{1-x-y}Cr_xV_y)$ (also those including B, Cr or the like added thereto) can be cited as a suitable composition (in the formula, x and y represent an arbitrary number equal to or less than 1).

More preferably, TiCN, TiN, TiSiN, TiSiCN, TiAlN, TiAlCrN, TiAlSiN, TiAlSiCrN, AlCrN, AlCrCN, AlCrVN, TiBN, TiAlBN, TiBCN, TiAlBCN, TiSiBCN, AlN, AlCN, AlO, $Al_2O_3$, $ZrO_2$, $(AlZr)_2O_3$, and the like can be cited. The first coat layer constituting the coat film will be described in further detail hereinafter.

<Residual Stress of First Coat Layer>

In the first coat layer of the present invention, the residual stress thereof greatly differs according to the depth of the chamfer portion as well as between the chamfer portion and a portion other than the chamfer portion, and satisfies all the conditions of (1)-(5) set forth below.

(1) The first coat layer at the chamfer portion has residual stress exhibiting a minimal value at a depth A that is within 2 μm from the surface.

(2) The minimal value of the aforementioned residual stress is greater than or equal to −7 GPa and less than or equal to −1 GPa.

(3) The residual stress increases continuously or stepwise as a function of depth further in the depth direction from depth A.

(4) A portion of the first coat layer other than the chamfer portion has residual stress greater than the minimal value of the residual stress of the chamfer portion in the first coat layer.

(5) A portion of the first coat layer other than the chamfer portion has residual stress increasing continuously or stepwise as a function of advancing towards the central direction of the rake face and the central direction of the flank face, and greater than or equal to 0 GPa and less than or equal 2 GPa at the base material side.

Figure 5:
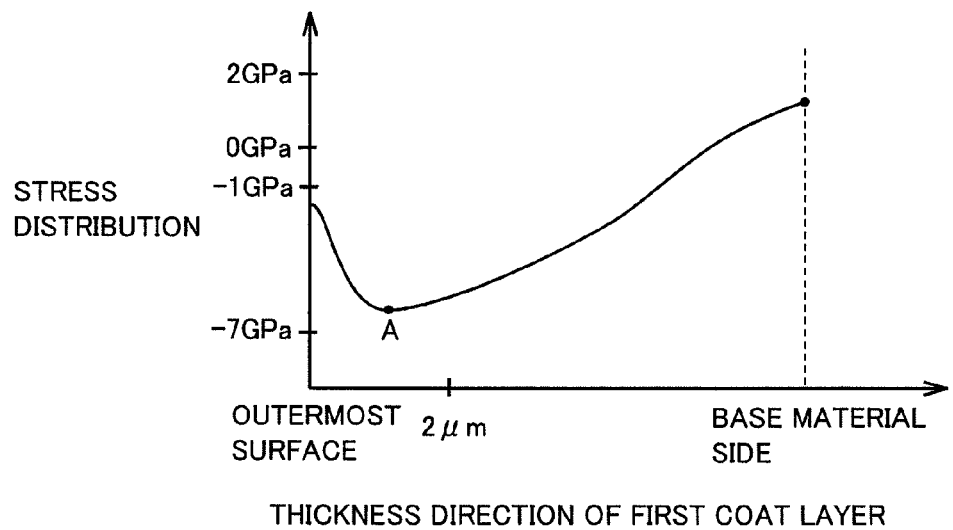
FIG. 5 is a graph of residual stress distribution taking a minimal value at a depth A of a first coat layer, and increasing continuously as a function of depth in the depth direction from depth A.
Figure 6:
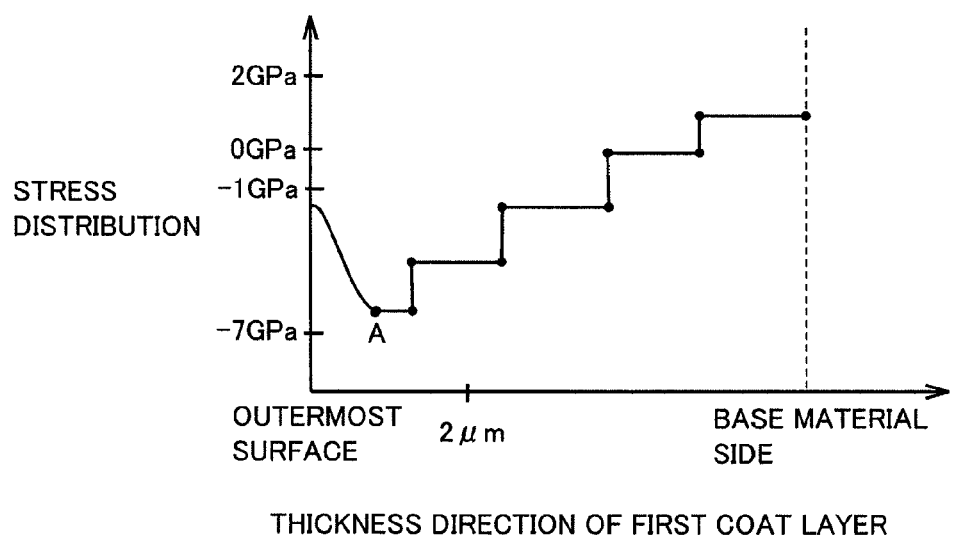
FIG. 6 is a graph of residual stress distribution taking a minimal value at a depth A of a first coat layer, and increasing stepwise as a function of depth in the depth direction from depth A.

An example of the stress distribution in the first coat layer satisfying the conditions of (1)-(3) among (1)-(5) set forth above is shown in FIGS. 5 and 6. FIG. 5 is a graph representing a stress distribution in which the minimal value is exhibited at depth A of the first coat film, and the residual stress increases continuously as a function of depth in the depth direction from said depth A, FIG. 6 is a graph similar to that of FIG. 5, provided that the increase of the residual stress is stepwise.

By virtue of the first coat layer of the present invention having such a stress distribution together with the crystal structure of the first coat layer that will be described afterwards, both the wear resistance and chipping resistance are highly established. In addition, the adherence between the base material and the coat film is further improved. By the minimal residual stress in the proximity of the surface of the coat film (first coat layer), development of a crack generated at the surface of the coat film during cutting can be suppressed. The conditions of (1)-(5) and resulting advantage will be described hereinafter.

By satisfying the condition of (1), the balance between wear resistance and chipping resistance can be maintained. Depth A where the residual stress is minimal is preferably located in the range greater than or equal to 0.1 μm and less than or equal to 1 μm from the surface of the first coat layer. If depth A exceeds 2 μm from the surface of the first coat layer, the balance between the wear resistance and chipping resistance is lost, which may degrade the tool lifetime.

Figure 8:
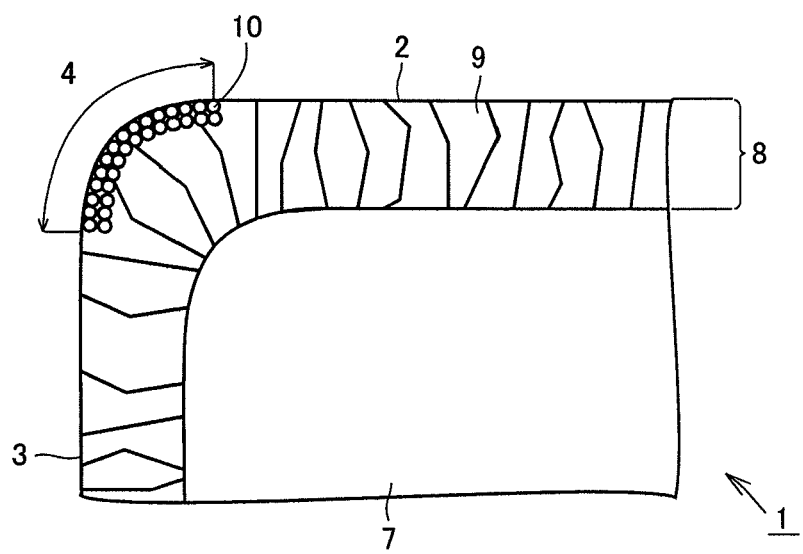
FIG. 8 is a schematic sectional view of a crystal structure of a first coat layer in the proximity of the chamfer portion.

By satisfying the condition of (2), a surface-coated cutting tool less susceptible to self destruction at the coat film during cutting, and superior in chipping resistance can be obtained. The minimal value of the residual stress is preferably greater than or equal to −5 GPa and less than or equal to −1.5 GPa. If the minimal value of the residual stress is less than −7 GPa, the compressive stress of the first coat film will be so high that self destruction will occur to facilitate chipping. If the minimal value exceeds −1 GPa, the chipping resistance required for a cutting tool cannot be achieved. As used herein, "minimal value" in the present invention implies the smallest value in numeric meaning, as well as the case where the residual stress indicates a constant numeric value continuously in the thickness direction of the first coat layer, as shown in FIG. 8 described afterwards.

The condition of (3) is provided for the purpose of excluding the case where the residual stress includes any locally high or low value. In the case where the residual stress is locally high or low, chipping will readily occur with that region as the origin. Such occurrence of chipping can be suppressed by satisfying the present condition (3) (variation of the residual stress in a continuous or stepped manner).

By satisfying the conditions of (4) and (5), the residual stress gradually increases (compressive stress also gradually reduces) towards the central direction of the rake face or flank face of the first coat layer. Accordingly, internal destruction of the coat film by its own stress can be prevented. The portion of the first coat layer other than the chamfer portion preferably has residual stress that is eventually greater than or equal to 0 GPa and less than or equal to 2 GPa. Exceeding the residual stress of 2 GPa at a portion of the first coat layer other than the chamfer portion is not preferable since the coat film will peel off at the chamfer portion depending upon the shape of the cutting tool. If the residual stress at the aforementioned base material side is less than 0 GPa, sufficient wear resistance cannot be achieved.

As used herein, "central direction of the rake face" implies the vector direction towards the center of the rake face from any one point of the ridge of the cutting edge that is the chamfer portion. Similarly, "central direction of the flank face" implies the vector direction towards the center of the flank face from any one point of the ridge of the cutting edge that is the chamfer portion.

As used herein, compressive stress in the present invention refers to a type of the internal stress present in the coat film (inheritance strain) represented by a "−" (minus) numeric value (unit:GPa). Therefore, high compressive stress (internal stress) means that the absolute value of the aforementioned numeric value becomes larger whereas a low compressive stress (internal stress) means that the absolute value of the above-described numeric value becomes smaller. It is to be noted that a numeric value represented with "+" (plus) refers to the tensile stress.

The distribution of the residual stress in the first coat layer in the present invention is measured by the $\sin^2\phi$ method set forth below. The $\sin^2\phi$ method using X-ray is extensively employed as a method of measuring the residual stress of polycrystalline material. The method of measurement is described in detail in "X-ray Stress Measurement Method" (The Society of Materials Science, Japan, 1981, issued by Yokendo Co., Ltd.), pp. 54-66.

In the present invention, first the penetration depth of the X-ray is fixed by a combination of the ISO-inclination method and side inclination method. The diffraction angle $2\theta$ relative to various $\phi$ directions in the plane including the measuring stress direction and the normal of the specimen surface at the position of measurement is measured to produce a $2\theta-\sin^2\phi$ line map. From the gradient, the compressive stress up to the relevant depth (distance from the surface of the coat film) is obtained.

More specifically, in the X-ray stress measurement method, an X-ray from an X-ray source is directed to the first coat layer at a predetermined angle. The X-ray diffracted at the first coat layer is detected with an X-ray detector. The internal stress is measured based on the detected value.

As an X-ray source for the measurement of the residual stress in the thickness direction of the coat film, synchrotron radiation (SR) is preferably used from the standpoint of the property of the X-ray source (high luminance, high degree of parallelization, variable wavelength, and the like).

In order to obtain the above-described compressive stress from a $2\theta-\sin^2\phi$ line map, the Young's modulus and Poisson's ratio of the coat film are preferably used. The Young's modulus can be measured using a dynamic hardness tester. For the Poisson's ratio, a value in the vicinity of 0.2 should be used since it does not vary greatly by the material. When the compressive stress is to be obtained from the $2\theta-\sin^2\phi$ line map, the Young's modulus does not necessarily have to be used. The compressive stress may be calculated using the lattice constant and lattice spacing instead.

<Composition of First Coat Layer>

Preferably, the first coat layer is formed of a compound including at least one type of element selected from the group consisting of the IVa group element (Ti, Zr, Hf, or the like), Va group element (V, Nb, Ta, or the like), VIa group element (Cr, Mo, W, or the like) of the periodic table of elements, aluminum (Al), silicon (Si), yttrium (Y), boron (B), and sulfur (S), and at least one type of element selected from the group consisting of boron, carbon, nitride, and oxygen (excluding the case where both elements are B), more preferably formed of alumina, and further preferably formed of alumina having an a type crystal structure <Crystal Structure of First Coat Layer>

Figure 7:
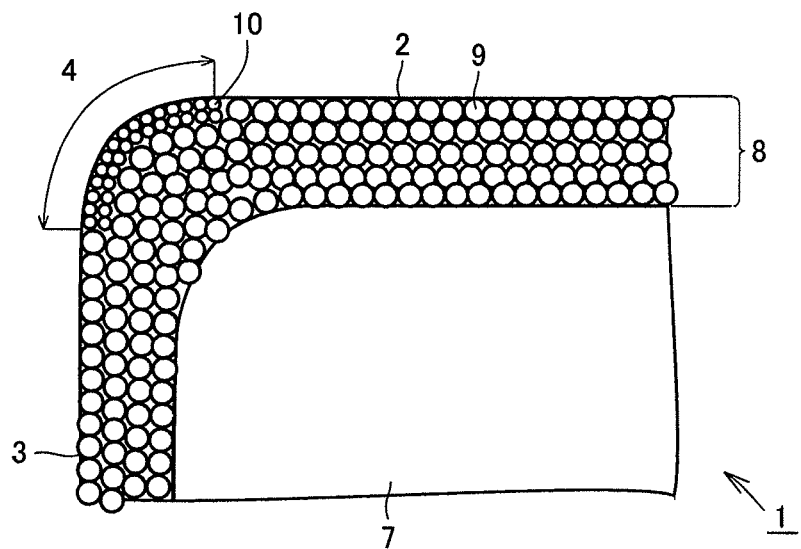
FIG. 7 is a schematic sectional view of a crystal structure of a first coat layer in the proximity of the chamfer portion.

FIGS. 7 and 8 are schematic sectional views of the crystal structure of the first coat layer in the neighborhood of the chamfer portion. FIGS. 7 and 8 represent the case where the coat film includes a first coat layer alone. First coat layer 8 of the present invention includes a fine crystal texture region 10 where the average grain size of the constituent compound is small and a rough crystal texture region 9 where the average grain size is large. The first coat layer is formed by the aggregation of compound crystal grains. The region where crystal grains having an average grain size of 10-200 nm aggregate is referred to as the fine crystal texture region, whereas the region where crystal grains larger than the crystal in the fine crystal texture region is referred to as the rough crystal texture region.

The fine crystal texture region constitutes the region up to a depth A from the surface of first coat layer 8 at chamfer portion 4, as shown in FIGS. 7 and 8. Specifically, first coat layer 8 at chamfer portion 4 is formed of two regions in the thickness direction, i.e. rough crystal texture region 9 at the side of base material 7 and fine crystal texture region 10 at the surface side. The thickness of fine crystal texture region 10 constitutes the region from the surface of first coat layer 8 up to depth A.

The present invention allows both wear resistance and chipping resistance to be highly established by virtue of first coat layer 8 taking the configuration set forth above. Specifically, the formation of fine crystal texture region 10 at the surface of first coat layer 8 reduces the unit of destruction of the coat film, leading to improvement in wear resistance. Moreover, the grain boundary increases by miniaturizing the crystal grains. Accordingly, a crack generated at the coat film surface side will not develop towards the base material side, leading to improvement in chipping resistance. Furthermore, the provision of an interface differing in grain size in the coat film suppresses the development of a crack at the interface between the fine crystal texture region and rough crystal texture region. Furthermore, improvement in toughness can be expected. The reason why large crystal grains are aggregated at the base material side is to improve the adherence between first coat layer 8 and base material 7 by the growth of the crystals in first coat layer 8 following the crystals constituting base material 7. Thus, first coat layer 8 of the present invention functions to highly establish both wear resistance and chipping resistance as well as to improve the adherence with base material 7.

In order to achieve the effect set forth above, the average grain size of the crystal grains in the fine crystal texture region must be greater than or equal to 10 nm and less than or equal to 200 nm, more preferably greater than or equal to 15 nm and less than or equal to 80 nm. If the grain size is less than 10 nm, the wear resistance will be degraded since the binding between grains constituting the crystal texture of first coat layer 8 will become weaker. If the average grain size exceeds 200 nm, the crystal texture of the coat film at the cutting surface will be so rough that adhesive wear occurs on the workpiece material, leading to degradation in the wear resistance.

Although the average grain size of the crystal grains in the rough crystal texture region has a different optimum range depending upon the average grain size of the crystal grains in the fine crystal texture region, the crystal grain size of the rough crystal texture region is basically greater than the crystal grain size of the crystal grains in the fine crystal texture region, and is preferably greater than or equal to 200 nm, more preferably greater than or equal to 300 nm and less than or equal to 1500 nm.

The average grain size of the crystal grains in the present invention can be obtained as set forth below. The base material and the coat film (first coat layer) formed on the base material are treated such that the cross section is visible with an FIB worked material. The cross section is observed with an FE-SEM (Field Emission-Scanning Electron Microscope). Through an observance as a reflected electron image, the portion having the same crystal orientation is observed at the same contrast. The portion of the same contrast is taken as one crystal grain.

Then, with respect to the obtained image, a straight line of an arbitrary length (preferably, around 400 µm) is drawn parallel to the surface of the base material at an arbitrary site of the first coat layer. The number of crystal grains included in the straight line is measured. The length of the straight line is divided by the number of crystal grains. The value thereof is taken as the average grain size at that site of the first coat layer.

The interface between the fine crystal texture region and rough crystal texture region is taken as the location where the orientation of the crystal in a direction perpendicular to the surface of the base material changes, based on the observance of the cross section of the coat film (first coat layer) using a transmission type electron microscope. Alternatively, in the case where a definite change based on the boundary of the site having such crystal orientation is not shown and the orientation changes with a certain width (the length in the direction perpendicular to the surface of the base material), the middle point of that width is taken as the interface between the fine crystal texture region and rough crystal texture region.

<Position of First Coat Layer>

In the case where the coat film is formed of a plurality of layers in the present invention, the first coat layer may be formed at the base material side or surface side of the coat film. Preferably, the first coat layer is located at the outermost surface layer. Accordingly, the first coat layer will be brought into contact with the workpiece material, suppressing any loss at the initial stage of cutting. The cutting performance can be improved and the lifetime increased. At the chamfer portion, the first coat layer is necessarily the outermost surface layer of the coat film.

<Thickness of First Coat Layer>

In the present invention, the first coat layer has a thickness preferably greater than or equal to 2 µm and less than or equal to 30 µm. Moreover, the upper limit of thickness is 20 µm, more preferably 10 µm. The lower limit of the thickness is 3 µm, more preferably 5 µm. If the thickness is less than 2 µm, the effect in improving the chipping resistance is not so appreciable since the effect of the residual compressive stress, when applied, is not sufficient. If the thickness exceeds 30 µm, the adherence with the base material or the layer located at the inner side of first coat layer may be degraded.

<Additional Layer Other than the First Coat Layer>

The coat film of the present invention may include one or more additional layer other than the above-described first coat layer. Such a layer includes an intermediate layer formed between the base material and the first coat layer, and/or the outermost surface layer formed on the first coat layer. These layers are provided for the purpose of anti-oxidation, lubrication, and the like, relative to the above-described effects of the first coat layer.

Particularly, the aforementioned intermediate layer is provided for the purpose of improving wear resistance and/or adherence with the base material. The intermediate layer may include one or more layers. The intermediate layer may be formed of, for example, TiC, TiN, TiCN, TiCNO, TiSiN, TiAlN, TiZrCN, TiAlCrN, TiAlSiN, TiAlCrSiN and the like. In these compositions, the ratio of respective atoms is not particularly limited, and follows the conventionally well known ratio. The intermediate layer is formed preferably to have a thickness greater than or equal to 0.2 µm and less than or equal to 1 µm, and residual stress greater than or equal to −1 GPa and less than or equal to −0.1 GPa.

The outermost surface layer is formed for the purpose of coloring or the like to identify a used cutting edge, and may include one or more layers. The outermost surface layer is formed of, for example Cr, CrN, TiN, TiCN, or the like. In these compositions, the ratio of respective atoms is not particularly limited, and follows the conventionally well known ratio. The outermost surface layer is preferably formed to have a thickness greater than or equal to 0.1 µm and less than or equal to 0.3 µm.

<Production Method>

The chamfer portion is formed by subjecting the ridge where the rake face and the flank face of the base material meet to grinding, brushing, barreling treatment, milling, and the like. A coat film is deposited on the base material with the chamfer portion formed.

For the method of producing a coat film of the present invention, the well known conventional method can be used without particular limitation. Preferably, the coat film is formed by chemical vapor deposition. Forming a coat film by CVD is advantageous in that each layer of the coat film has residual tensile stress, exhibiting high adherence with the base material.

The formed coat film is characterized in that the chamfer portion of the first coat layer is subjected to blasting locally. Accordingly, compressive stress can be applied to the chamfer portion at the surface side of the first coat layer, and the average grain size of the crystal grains located up to depth A from the surface of the first coat layer at the chamfer portion is reduced to be greater than or equal to 10 nm and less than or equal to 200 nm.

Blasting is carried out by preparing a dispersing solvent having abrasive grains dispersed directly or into a solvent such as of water, and causing the dispersing solvent to collide against the surface of the first coat layer. In the present invention, blasting is carried out with the volume ratio of the grains in the dispersing solvent varied in the range greater than or equal to 5 volume % and less than or equal to 40 volume % while gradually thinning the abrasive grain concentration by increasing the concentration of the liquid in the dispersing solvent continuously or stepwise. The abrasive grains are preferably based on a mixture of at least two types of powder differing in specific gravity and hardness. For example, a mixture of two types of powder, i.e. powder of diamond, boron nitride, silicon carbide, or the like of high hardness and low specific gravity, and powder such as of zirconia, tantalum carbide, tungsten carbide, or the like having low hardness and high specific gravity is preferably used. Furthermore, the blast treatment may be divided into two stages, using different powder at each step.

The collision condition of the abrasive grains may be adjusted appropriately depending upon the configuration of the coat film and/or the level of the applied residual compressive stress. Preferably, the pressure projection is greater than or equal to 0.01 MPa and less than or equal to 0.5 MPa; the projection distance is greater than or equal to 0.5 mm and less than or equal to 50 mm; and the projection angle is at right angle to the chamfer portion. If the collision strength of the grains is not sufficient, the desired residual compressive stress cannot be applied. It is therefore preferable to apply collision at an appropriate strength.

Although the present invention is characterized in that the residual stress and grain size of the first coat layer at the chamfer portion are altered by blasting set forth above, the case where a portion of the first coat layer other than the chamber portion has residual stress and grain size equal to the region of the first coat layer at the chamfer portion and the case where the residual stress and grain size set forth above are partially satisfied at the chamfer portion of the first coat layer are included in the scope of the present invention as long as the advantage of the present invention is not degraded.

EXAMPLES

Although the present invention will be described in further detail based on examples, the present invention will not be limited thereto. The compound composition of the coat films in the examples and comparative examples were confirmed by an X-ray photoelectron spectrometer (XPS).

Raw material powder based on the blend of 86 mass % of WC, 8.0 mass % of Co, 2.0 mass % of TiC, 2.0 mass % of NbC, and 2.0 mass % of ZrC was mixed for 72 hours using a bowl mill. Then, the mixture was dried, press-formed, and subjected to sintering for 1 hour at the temperature of 1420° C. in a vacuum atmosphere to produce the base material for a throwaway tip made of WC based cemented carbide (shape: Sumitomo Electric Hardmetal Corp., CNMG120408).

The cutting edge of such base material was subjected to chamfering by means of a nylon brush including SiC abrasive grains to form a round honing as the chamfer portion. Then, the surface of the base material was cleaned.

By means of the well-known thermal CVD method, each layer of the coat film shown in the column of "Layer Structure" in Table 1 was formed on the base material (the layer of the composition from the right side indicated in the column of "layer structure" in Table 1 was formed on the base material in the cited order). For example, Example 3 had a TiN layer of 0.3 μm in thickness, a TiCN layer of 10 μm in thickness, then a TiCNO layer of 0.5 μm in thickness, and a κ-$Al_2O_3$ layer of 4 μm in thickness formed in the cited order from the base material side. The first coat layer in each example is the outermost surface layer.

The chamfer portion of the first coat layer was subjected to blasting using zirconia having a hardness lower than and a specific gravity greater than the coat film, and diamond abrasive grains of high hardness and low specific gravity. Specifically, the abrasive grain concentration was gradually thinned while the concentration of the liquid was increased continuously or stepwise and adjusting the projection distance of 0.5-50 mm at the projection pressure of 0.01-0.5 MPa to subject the chamfer portion of the coat film to blasting. Thus, the first coat layer was treated by two types of media to attain the residual stress and fine texture indicated in Table 1 below. The "Increasing Manner" column in Table 1 indicates whether the increasing manner of the residual stress was "continuously" or "stepwise". In the comparative example, "constant" in the corresponding column implies that the increasing manner of the residual stress at the first coat layer was constant.

The surface-coated cutting tool in each of examples was fabricated by a similar way. The surface-coated cutting tool in each of the comparative examples was produced according to a method similar to that of each of the examples set forth above, provided that the above-described blasting was not carried out.

The distribution of the residual stress at the first coat layer was measured by the $\sin^2\phi$ method for the produced surface-coated cutting tool. The average grain size of the first coat layer was based on observing the cross section of the coat film according to the method set forth above.

In the measurement by the $\sin^2\phi$ method, the energy of the employed X-ray was 10 keV, and the peak of the diffraction line was the (166) plane of α type $Al_2O_3$. The measured diffraction peak position was determined by the fitting of the Gauss function. The inclination of the $2\theta$–$\sin^2\phi$ line graph was obtained. For the Young's modulus, the value obtained using a dynamic hardness tester (MST-made nanoindenter) was used. For the Poisson ratio, the value of $Al_2O_3$ (0.2) was used.

TABLE 1

| | | | Coat Film | | | | | | | |
|---|---|---|---|---|---|---|---|---|---|---|
| | | | | | First Coat Layer | | | | | |
| | | | | | | | Residual Stress | | | |
| | | Layer Structure | Film Thickness | Depth A | | Minimal Value | Last | Increasing | Average Grain Size (μm) | |
| | | * Layer thickness (μm) indicated in the parenthesis | (μm) | (μm) | Composition | (GPa) | (GPa) | Manner | Fine | Rough |
| EXAMPLE | 1 | TiCN(5) | 5 | 2 | TiCN | −5 | 0 | continuous | 50 | 100 |
| | 2 | TiCNO(3)/TiN(0.5) | 3.5 | 1 | TiCNO | −2 | 0.2 | stepwise | 20 | 80 |
| | 3 | κ type $Al_2O_3$(4)/TiCNO(0.5)/TiCN(10)/TiN(0.3) | 14.8 | 1 | κ type $Al_2O_3$ | −1.5 | 3 | continuous | 30 | 200 |
| | 4 | κ type $Al_2O_3$(3)/TiCNO(0.5)/TiCN(12)/TiBCN(2)/TiN(0.3) | 18.8 | 0.5 | κ type $Al_2O_3$ | −2 | 0 | stepwise | 20 | 250 |
| | 5 | α type $Al_2O_3$(6)/TiBN(0.5)/TiCN(10)/TiN(0.3) | 16.8 | 1 | α type $Al_2O_3$ | −3 | 0.5 | continuous | 89 | 180 |
| | 6 | (Al·Zr)$_2O_3$(16)/TiBN(0.5)/TiCN(10)/TiN(0.3) | 26.8 | 2 | (Al·Zr)$_2O_3$ | −6.5 | 1.8 | continuous | 180 | 300 |
| | 7 | κ type $Al_2O_3$(14)/TiBN(0.5)/TiZrCN(30)/TiN(0.3) | 44.8 | 2 | κ type $Al_2O_3$ | −5 | 1 | stepwise | 120 | 263 |
| Comparative | 1 | TiCN(1.5) | 1.5 | — | — | 0.3 | 0.3 | constant | 300 | |
| Example | 2 | TiCN(5) | 5 | 3.5 | — | −2 | 0.1 | constant | 180 | |
| | 3 | κ type $Al_2O_3$(6)/TiBN(0.5)/TiCN(10)/TiN(0.3) | 16.8 | 2 | — | −8 | −1 | constant | 94 | |

TABLE 1-continued

| | Coat Film | | | | | | | |
|---|---|---|---|---|---|---|---|---|
| | | | First Coat Layer | | | | | |
| | | | | | Residual Stress | | | Average Grain Size (μm) |
| | Layer Structure | Film Thickness | Depth A | | Minimal Value | Last | Increasing | |
| | * Layer thickness (μm) indicated in the parenthesis | (μm) | (μm) | Composition | (GPa) | (GPa) | Manner | Fine | Rough |
| 4 | TiN(1)/Al$_2$O$_3$(6)/TiBN(0.5)/TiCN(10)/TiN(0.3) | 17.8 | 0.5 | — | −1 | 0 | constant | 45 |
| 5 | α type Al$_2$O$_3$(33)/TiBN(2)/TiCN(20)/TiN(2) | 57 | 2 | — | −8 | 0.1 | constant | 263 |

In the column of "Film Thickness" for each layer in Table 1, the thickness of each layer constituting the coat film was indicated in the parenthesis at the side of each layer in Table 1. The film thickness and layer thickness were obtained by cutting at a plane including the normal to the surface of the surface-coated cutting tool, and using relevant values based on an observation of the cut face by an SEM.

In Table 1, the column "Depth A" indicates the distance where the residual stress becomes minimal from the surface of the first coat layer. The minimal value of the relevant residual stress is indicated in the column of "Minimal Value" in Table 1. The column of "Increasing Manner" indicates whether the increasing manner of the residual stress towards the central direction of the rake face and flank face is "continuous" or "stepwise".

The column of "Fine" in "Average Grain Size" represents the average grain size of the crystal grains from the surface of the first coat layer down to depth A at the chamfer portion (fine crystal texture region). The column of "Rough" represents the average grain size of the crystal grains at a portion of the first coat layer other than the fine crystal texture region.

<Cutting Specimen>

Using the surface-coated cutting tool of each example and each comparative example, a lathe turning cutting test was carried out in accordance with the conditions set forth below.

| Workpiece material: | FCD700 round rod with a groove |
|---|---|
| Cutting speed: | 230 m/min |
| Feed rate: | 0.15 mm/rev |
| Cut: | 1.0 mm |
| Cutting oil: | used |

The time before chipping was generated at the surface-coated cutting tool from the start of the cutting test is shown in the column of "Chipping Occurring Time" in Table 2. A longer chipping occurring time implies that chipping does not readily occur at the cutting tool.

By measuring the surface-coated cutting tool with the vernier caliper for every one minute from the start of the cutting test, the width of the reduction by wear at the flank face was calculated, and the time until this width exceeded 0.25 mm in average is indicated in the column of "Tool Lifetime" in Table 2. A longer tool lifetime implies that the lifetime of the surface-coated cutting tool is longer.

TABLE 2

| | | Chipping Occurring Time (min) | Tool Lifetime (min) |
|---|---|---|---|
| Example | 1 | 21 | 55 |
| | 2 | 20 | 53 |
| | 3 | 42 | 78 |
| | 4 | 32 | 81 |
| | 5 | 35 | 101 |
| | 6 | 22 | 88 |
| | 7 | 18 | 92 |
| Comparative Example | 1 | 2 | 10 |
| | 2 | 3 | 20 |
| | 3 | 8 | 25 |
| | 4 | 5 | 26 |
| | 5 | 1 | 18 |

It is apparent from the results in Table 2 that the surface-coated cutting tool of each example of the present invention has a small wear amount at the flank face and chipping does not readily occur, as compared to those of the comparative example. From these results, it can be said that the surface-coated cutting tool of each example of the present invention is superior in wear resistance and chipping resistance, as compared to those in each of the comparative examples. The reason why the wear resistance and chipping resistance of the surface-coated cutting tool in each of the examples set forth above are improved is due to miniaturizing the crystals at the chamfer portion of the first coat layer and locally reducing the residual stress at that portion.

From the above results, it was identified that the surface-coated cutting tool of the examples were superior in wear resistance and chipping resistance, as compared to the surface-coated cutting tool of the comparative examples.

Although the present invention has been described based on embodiments and examples as set forth above, it is intended that the features of the embodiments and examples may be combined appropriately.

Furthermore, it should be understood that the embodiments and examples disclosed herein are illustrative and non-restrictive in every respect. The scope of the present invention is defined by the terms of the claims, rather than description set forth above, and is intended to include any modification within the scope and meaning equivalent to the terms of the claims.

REFERENCE SIGNS LIST

1 surface-coated cutting tool; 2 rake face; 3 flank face; 4 chamfer portion; 5 workpiece material; 6 swarf; 7 base material; 8 first coat layer; 9 rough crystal texture region; 10 fine crystal texture region; 20 through hole.

The invention claimed is:

1. A surface-coated cutting tool including a base material, and a coat film formed on said base material, said surface-coated cutting tool having a chamfer portion where a rake face and a flank face meet, said coat film including at least one layer of a first coat layer, said first coat layer being an outermost surface layer of said coat film at said chamfer portion, said first coat layer at said chamfer portion having residual stress that exhibits a minimal value at a depth A within 2 μm from the surface of said chamfer portion, and that increasing continuously or stepwise as a function of depth in a further depth direction from said depth A, said minimal value of said residual stress being greater than or equal to −7 GPa and less than or equal to −1 GPa, said first coat layer at a portion other than said chamfer portion having residual stress greater than the minimal value of said residual stress, said first coat layer at a portion other than said chamfer portion having residual stress that increases continuously or stepwise as a function of advance in a central direction of the rake face and a central direction of the flank face, and that is greater than or equal to 0 GPa and less than or equal to 2 GPa at said base material side, in the first coat layer at said chamfer portion, a region up to said depth A from the surface being a fine crystal texture region including crystals having an average grain size greater than or equal to 10 nm and less than or equal to 200 nm, and in said first coat layer, a region further deeper in a depth direction from said depth A at said chamfer portion, and a region other than said chamfer portion being a rough crystal texture region including crystals larger than the crystals in said fine crystal texture region.

2. The surface-coated cutting tool according to claim 1, wherein said first coat layer has a thickness greater than or equal to 2 μm and less than or equal to 30 μm.

3. The surface-coated cutting tool according to claim 1, wherein said coat film is formed of a compound including at least one type of element selected from the group consisting of a IVa group element, Va group element, VIa group element, Al, Si, Y, B, and S, and at least one type of element selected from the group consisting of boron, carbon, nitride, and oxygen.

4. The surface-coated cutting tool according to claim 1, wherein said coat film includes one or more layer other than said first coat layer.

5. The surface-coated cutting tool according to claim 1, wherein said coat film has an entire thickness greater than or equal to 3 μm and less than or equal to 50 μm.

6. The surface-coated cutting tool according to claim 1, wherein said first coat layer is formed of alumina.

* * * * *